US005559830A

United States Patent [19]

Dapper et al.

[11] Patent Number: 5,559,830

[45] Date of Patent: Sep. 24, 1996

[54] EQUALIZATION SYSTEM FOR AM COMPATIBLE DIGITAL RECEIVER

[75] Inventors: Mark J. Dapper, Cincinnati; Michael J. Geile, Loveland; Barry W. Carlin, Greenhills, all of Ohio

[73] Assignee: Xetron Corp., Cincinnati, Ohio

[21] Appl. No.: 376,986

[22] Filed: Jan. 23, 1995

[51] Int. Cl.[6] .......... H03H 7/30

[52] U.S. Cl. .......... 375/230; 375/232

[58] Field of Search .......... 375/229, 230, 375/231, 232, 233, 235, 320; 364/724.19, 724.2; 333/18, 28 R

[56] References Cited

U.S. PATENT DOCUMENTS

| | | | |
|---|---|---|---|
| 4,550,415 | 10/1985 | Debus, Jr. et al. | 375/234 |
| 4,843,583 | 6/1989 | White et al. | 364/724.19 |
| 4,847,797 | 7/1989 | Picchi et al. | 375/235 |
| 5,113,142 | 5/1992 | Yoshikawa | 329/306 |
| 5,175,747 | 12/1992 | Murakami | 375/14 |
| 5,214,671 | 5/1993 | Nakai | 375/14 |
| 5,243,624 | 9/1993 | Paik et al. | 375/12 |
| 5,268,930 | 12/1993 | Sendyk et al. | 375/231 |
| 5,448,590 | 9/1995 | Kostic | 375/229 |

*Primary Examiner*—Wellington Chin
*Assistant Examiner*—Huong Luu

[57] ABSTRACT

An equalizer is provided for enhancing the recoverability of digital audio broadcasting signal information. The equalizer receives the AM compatible digital audio broadcasting waveform and stores that waveform as a waveform vector. The equalizer then processes that waveform by multiplying the waveform vector by an equalization vector. This equalization vector comprises a plurality of equalizer coefficients, each of the coefficients initially set to a predetermined value. The equalizer then compares each location of the processed waveform vector with a stored waveform vector. The equalizer selects as the signal that vector location closest to the stored waveform vector. Preferably, the equalizer includes means for updating the equalizer coefficients using the waveform vector, the processed waveform vector, and the stored waveform vector to provide immunity to noise.

4 Claims, 1 Drawing Sheet

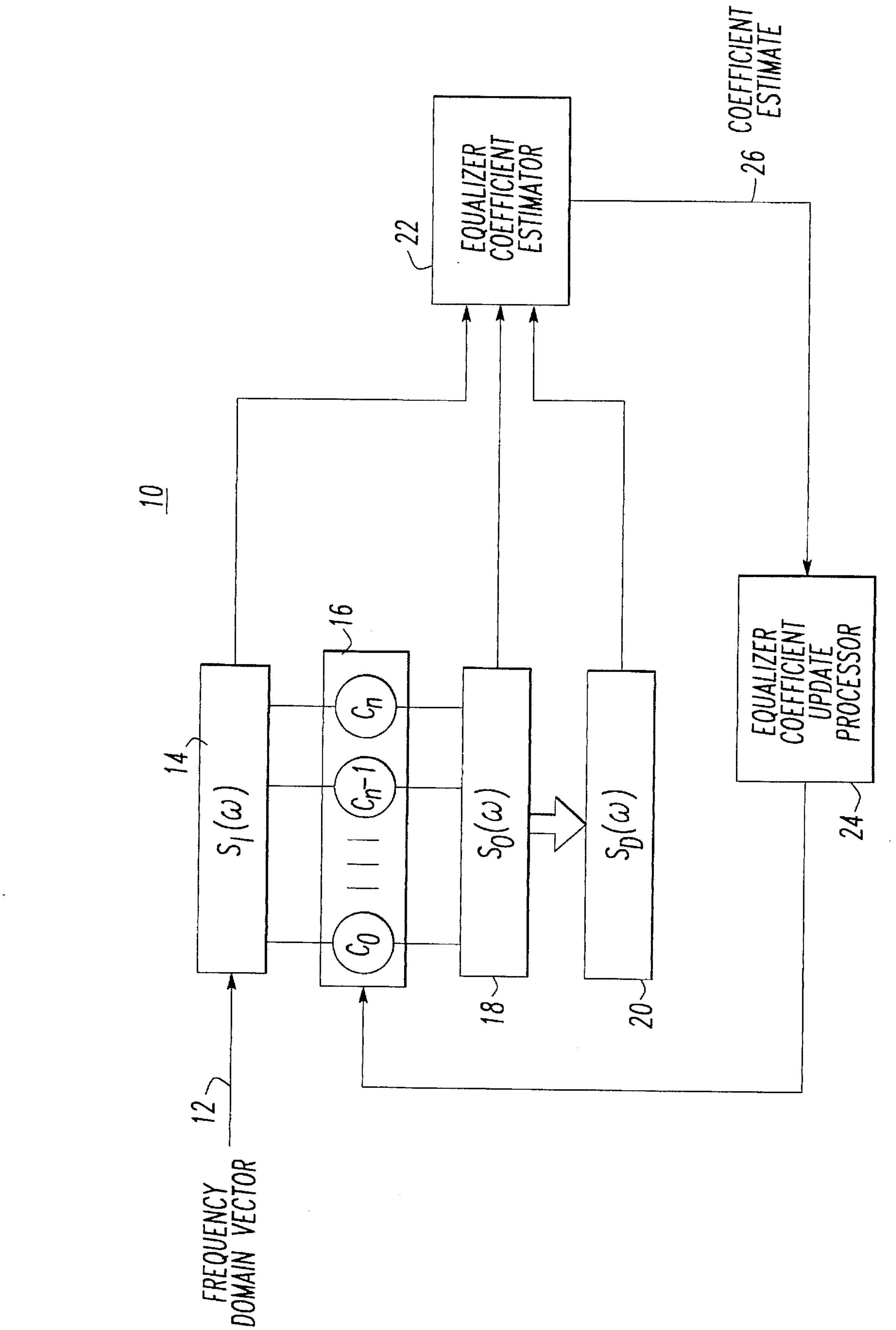
10
FREQUENCY DOMAIN VECTOR
12
14
S_I(ω)
16
C_0
C_n-1
C_n
18
S_O(ω)
20
S_D(ω)
22
EQUALIZER COEFFICIENT ESTIMATOR
26
COEFFICIENT ESTIMATE
EQUALIZER COEFFICIENT UPDATE PROCESSOR
24

EQUALIZATION SYSTEM FOR AM COMPATIBLE DIGITAL RECEIVER

BACKGROUND OF THE INVENTION

1. Field Of The Invention

This invention relates to radio broadcasting and, more particularly, to methods of and apparatus for equalizing the demodulated signal in a receiver for an amplitude modulated compatible digital broadcasting system.

2. Description Of Related Art

There has been increasing interest in the possibility of broadcasting digitally encoded audio signals to provide improved audio fidelity. Several approaches have been suggested. One such approach, set forth in co-pending patent application Ser. No. 08/206,368, filed Mar. 7, 1994, assigned to the assignee hereof, teaches a method for simultaneously broadcasting analog and digital signals in a standard AM broadcasting channel. An amplitude modulated radio frequency signal having a first frequency spectrum is broadcast. The amplitude modulated radio frequency signal includes a first carrier modulated by an analog program signal. Simultaneously, a plurality of digitally modulated carrier signals are broadcast within a bandwidth which encompasses the first frequency spectrum. Each of the digitally modulated carrier signals is modulated by a portion of a digital program signal. A first group of the digitally modulated carrier signals lies within the first frequency spectrum and is modulated in quadrature with the first carrier signal. Second and third groups of the digitally modulated carrier signals lie outside of the first frequency spectrum and are modulated both in-phase and in-quadrature with the first carrier signal. Both transmitters and receivers are provided in accordance with that method.

The waveform in the AM compatible digital audio broadcasting system described in U.S. Patent application Ser. No. 08/206,368, filed Mar. 7, 1994, hereby incorporated herein by reference, has been formulated to provide optimal data throughput for the digital signal while avoiding crosstalk into the analog AM channel. Multiple carriers are employed by means of orthogonal frequency division multiplexing (OFDM) to bear the communicated information. The received multi-carrier signal requires equalization in the presence of dynamic channel response variations. Without such equalization, a very distorted signal would be detected and the digital broadcasting signal information would be unrecoverable.

SUMMARY OF THE INVENTION

The equalization structure of the present invention enhances the recoverability of the digital audio broadcasting signal information. The equalizer includes means for receiving the AM compatible digital audio broadcasting waveform and storing that waveform as a waveform vector. The equalizer then processes that waveform by multiplying the waveform vector by an equalization vector. This equalization vector comprises a plurality of equalizer coefficients, each of the coefficients initially set to a predetermined value. The equalizer then compares each location of the processed waveform vector with a stored waveform vector. The equalizer selects as the signal that vector location closest to the stored waveform vector. Preferably, the equalizer includes means for updating the equalizer coefficients using the waveform vector, the processed waveform vector, and the stored waveform vector to provide immunity to noise.

BRIEF DESCRIPTION OF THE DRAWINGS

The invention will be more readily apparent to those skilled in the art by reference to the accompanying drawing wherein:

The Figure is a block diagram of the adaptive equalizer architecture provided in accordance with this invention.

DETAILED DESCRIPTION OF THE PREFERRED EMBODIMENTS

This invention provides a system for adaptively equalizing an amplitude modulated compatible digital audio broadcast signal. The preferred implementation for equalizing the digital audio broadcast waveform is illustrated in the Figure which shows equalizer 10. Equalizer 10 acts on the signal received by the receiver detector, not shown, in order to minimize distortions in the received signal.

In the preferred detector implementation, as discussed in patent application Ser. No. 08/206,368, filed Mar. 7, 1994, assigned to the assignee herein, and hereby incorporated by reference, the received information is produced in the frequency domain by means of a fast Fourier transform. This frequency domain information is presented to equalizer 10 as frequency domain vector 12. Each block of frequency domain information is stored in storage array 14 as the signal $S_I(\Omega)$. This storage array vector 14 is multiplied by a plurality of equalizer coefficients 16. The resulting product of this multiplication is equalized signal 18 represented as $S_o(\Omega)$.

A set of exact values, not shown in the Figure, is known a priori in equalizer 10. Each vector location of equalized signal $S_o(\omega)$ is compared with the set of exact values. Any standard comparator known to those skilled in the art can be used to make this comparison. The comparator selects the ideal value closest to that described in the vector location as the actual signal value. The vector of resulting decisions from the comparator is stored in decision array 20 forming $S_D(\omega)$.

Using the received signal $S_1(\omega)$, the equalized signal $S_o(\omega)$ and decision array $D_D(\omega)$, an equalizer coefficient estimator 22 calculates coefficient estimate 26. To provide immunity to noise, a coefficient update processor 24 updates equalizer coefficients 16. The rate of coefficient update determines equalizer noise immunity and convergence rate. Coefficients in different pans of the band may be updated at different rates depending on knowledge of the distortion mechanism. By providing the ability to update the coefficients, the equalizer 10 of the present invention provides an adaptive system which enhances the ability of the equalized AM compatible digital audio broadcasting waveform to be detected.

In the foregoing specification certain preferred practices and embodiments of this invention have been set out, however, it will be understood that the invention may be otherwise embodied within the scope of the following claims.

We claim:

1. An equalizer for producing an output signal in a receiver provided in an amplitude modulated compatible digital broadcasting system comprising:

a. means for receiving an amplitude modulated compatible digital broadcasting waveform and storing said waveform as a waveform vector in the frequency domain;

b. means for processing said waveform by multiplying said waveform vector by an equalization vector, said equalization vector comprising a plurality of equalizer coefficients, said equalizer coefficients initially set to a predetermined value;

c. means for comparing each location of said processed waveform vector with a stored waveform vector and selecting as the signal that vector location closest to said stored waveform vector; and d. means for updating said equalizer coefficients using said waveform vector, said processed waveform vector and said stored waveform vector.

2. The equalizer of claim 1 wherein said means for updating said equalizer coefficients modifies said coefficients individually.

3. A method for equalizing an amplitude modulated compatible digital broadcasting waveform comprising the steps of a. receiving an amplitude modulated compatible digital broadcasting waveform and storing said waveform as a waveform vector in the frequency domain;

b. processing said waveform by multiplying said waveform vector by an equalization vector, said equalization vector comprising a plurality of equalizer coefficients, said equalizer coefficients initially set to a predetermined value;

c. comparing each location of said processed waveform vector with a stored waveform vector and selecting as the signal that vector location closest to said stored waveform vector; and d. updating said equalizer coefficients using said waveform vector, said processed waveform vector and said stored waveform vector.

4. The method of claim 3 wherein said equalizer coefficients are modified individually.

* * * * *